(12) United States Patent
Kubota et al.

(10) Patent No.: US 6,396,077 B1
(45) Date of Patent: May 28, 2002

(54) SEMICONDUCTOR DEVICE PROVIDED WITH CONDUCTIVE LAYER AND LIQUID CRYSTAL DISPLAY

(75) Inventors: Takeshi Kubota, Hyogo; Ichiro Murai, Nagano, both of (JP)

(73) Assignees: Mitsubishi Denki Kabushiki Kaisha, Tokyo; Seiko Epson Corporation, Nagano, both of (JP)

(*) Notice: Subject to any disclaimer, the term of this patent is extended or adjusted under 35 U.S.C. 154(b) by 0 days.

(21) Appl. No.: 09/715,023

(22) Filed: Nov. 20, 2000

(30) Foreign Application Priority Data

Dec. 13, 1999 (JP) ............................................ 11-352895

(51) Int. Cl.$^7$ ........................ H01L 29/04; G02F 1/1343
(52) U.S. Cl. ........................ 257/59; 257/72; 257/347; 257/350; 349/38
(58) Field of Search ........................ 257/59, 72, 347, 257/350, 405, 645, 651; 349/43, 38

(56) References Cited

U.S. PATENT DOCUMENTS 6,141,066 A * 10/2000 Matsushima ................. 349/38

FOREIGN PATENT DOCUMENTS

| JP | 9-292626 | | 11/1997 |
| JP | 10-26772 | * | 1/1998 |
| JP | 11-223836 | * | 8/1999 |

OTHER PUBLICATIONS

"Ultra LSI Process Data Handbook", Science Forum, Mar. 31, 1999, p. 232, Akasaka et al.

* cited by examiner

*Primary Examiner*—Minh Loan Tran
(74) *Attorney, Agent, or Firm*—Leydig, Voit, & Mayer, Ltd.

(57) ABSTRACT

A semiconductor device and a liquid crystal display stabilizing the threshold voltage of a thin-film field effect transistor while enhancing durability and reliability of a capacitor having as a component a conductive layer formed in the same layer as the channel region of the thin-film field effect transistor. The semiconductor device includes a thin-film field effect transistor and a conductive layer. It includes a substrate, semiconductor layers, conductive layer, and a dielectric film. Semiconductor layers include channel regions of thin-film field effect transistors on the substrate. A conductive layer is formed on substrate in the same layer as semiconductor layers. A dielectric film is formed on conductive layer. The impurity concentration of channel regions is at most $10^{16}$ atoms/cm$^3$. The impurity concentration of dielectric film is at most $10^{17}$ atoms/cm$^3$.

4 Claims, 11 Drawing Sheets

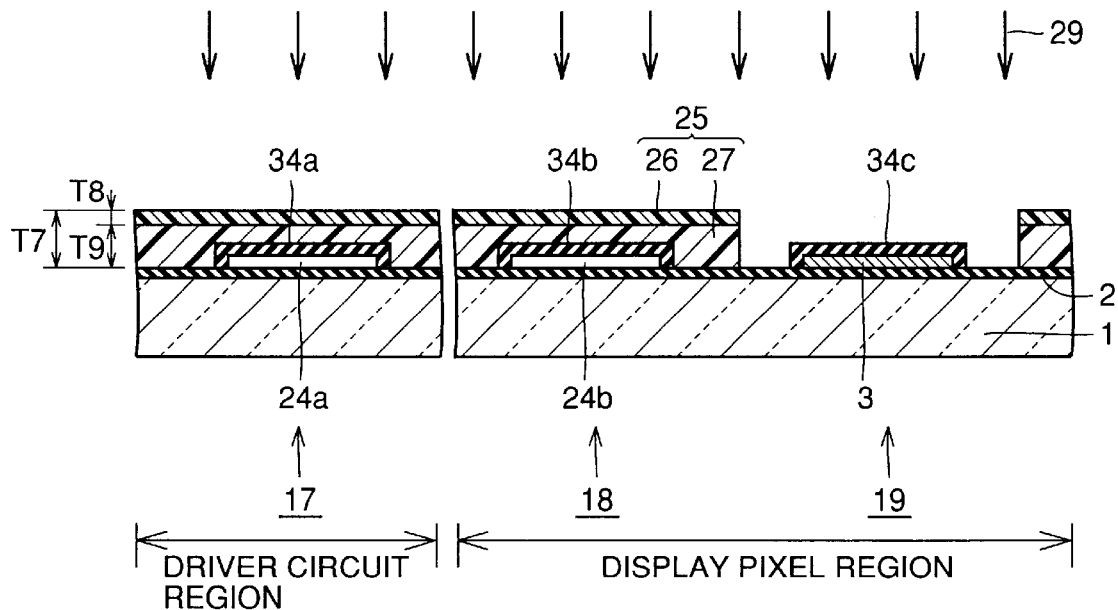
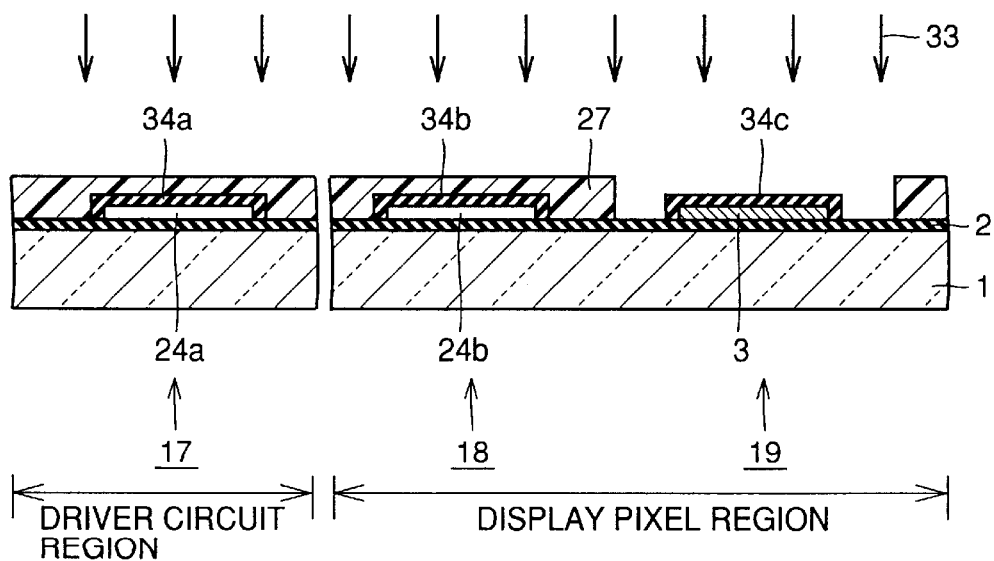

SEMICONDUCTOR DEVICE PROVIDED WITH CONDUCTIVE LAYER AND LIQUID CRYSTAL DISPLAY

BACKGROUND OF THE INVENTION

1. Field of the Invention

The present invention relates to semiconductor devices, liquid crystal displays, and manufacturing methods thereof. More specifically, it relates to a semiconductor device provided with a thin-film field effect transistor and a conductive layer, a liquid crystal display, and manufacturing methods thereof

2. Description of the Background Art

Conventionally, one type of liquid crystal display is known utilizing a thin-film field effect transistor formed with low-temperature polysilicon. Such a liquid crystal display usually requires a capacitor for accumulation of electric charges. FIG. 13 shows a substrate with a thin-film field effect transistor of the liquid crystal display. FIG. 13 is a schematic cross a sectional view showing a conventional liquid crystal display. Referring to FIG. 13, the conventional liquid crystal display will be described.

In FIG. 13, the liquid crystal display has a driver circuit region and a display pixel region. On a glass substrate 101, a p channel thin-film field effect transistor 117 is located in the driver circuit region, whereas an n channel thin-film field effect transistor 118 and a storage capacitor 119 are located in the display pixel region.

In the driver circuit region, a base film 102 is formed on the glass substrate. Formed on base film 102 are source/drain regions 106a, 106b and a channel region 107 of p type thin-film field effect transistor 117, which are originally formed in the same layer of a polysilicon film as a semiconductor film. P type conductivity impurities are implanted into source/drain regions 106a, 106b. An insulating film 108 serving as a gate insulating film is formed on source/drain regions 106a, 106b and channel region 107. In the region above channel region 107, a gate electrode 109a is formed on insulating film 108. A protective film 111 is formed on gate electrode 109. Contact holes 112a, 112b are formed opposite source/drain regions 106a, 106b by partially etching protective film 111 and insulative film 108. Electrodes 113a, 113b are formed in contact holes 112a, 112b, extending on the surface of protective film 111. An insulative film 114 is formed on electrodes 113a, 113b and protective film 111.

In the display pixel region of the liquid crystal display, base film 102 is formed on glass substrate 101. Formed on base film 102 are source/drain regions 104a, 104b and a channel region 105 of an n channel thin-film field effect transistor 118, which are originally formed in the same layer of a polysilicon film as a semiconductor film. In addition, on base film 102, a lower electrode 103 of storage capacitor 119 is formed by the same layer of semiconductor film as that of source/drain regions 104a, 104b and channel region 105. Insulative film 108 is formed on source/drain regions 104a, 104b, channel region 105, and lower electrode 103. Insulative film 108 has portions respectively serving as a gate insulating film of n channel thin-film field effect transistor 118 and a dielectric film of storage capacitor 119. Namely, insulative film 108 on channel region 105 serves as a gate insulative film, whereas insulative film 108 on lower electrode 103 serves as a dielectric film. In the region on channel region 105, a gate electrode 109b is formed on insulative film 108. In the region on lower electrode 103, a common electrode 110 is formed on insulative film 108 serving as a dielectric film. A protective film 111 is formed on gate electrode 109b and common electrode 110. Protective film 111 and insulative mm 108 are partially etched and removed to form contact holes 112c to 112e. Electrodes 113c to 113e are respectively formed in contact holes 112c to 112e to extend on the surface of protective film 111. An insulative film 114 is formed on electrodes 113c to 113e and protective film 111. Thereafter, a transparent electrode and the like are formed in the display pixel region to manufacture a liquid crystal display in a conventional process.

As described above, the gate insulative film of p and n channel thin-film field effect transistors 117 and 118 and the dielectric film of storage capacitor 119 are formed by the same layer, i.e., insulative film 108. Thus, the manufacturing process of the liquid crystal display is simplified When a coplanar thin-film field effect transistor is used, lower electrode 103 of storage capacitor 119 is formed by implanting impurities in the same semiconductor film as that forming channel regions 107 and 105 of p and n channel thin-film field effect transistors 117 and 118. This is because the thin-film field effect transistor is extremely sensitive to metal impurities in a process up to formation of the gate insulative film and it is substantially difficult to form a metal electrode below the gate insulative film.

FIGS. 14 to 16 are schematic cross sectional views shown in conjunction with the manufacturing method of the liquid crystal display in FIG. 13. Referring to FIGS. 14 to 16, the manufacturing method of the liquid crystal display will be described.

Referring first to FIG. 14, a base film 102 is formed on a glass substrate 101 by a general method such as PECVD (Plasma Enhanced Chemical Vapor Deposition). A 2-layer film of silicon nitride and oxide films can be used as base film 102. An amorphous silicon film is formed on base film 102. The amorphous silicon film to be channel regions of p and n type thin-film field effect transistors 117 and 118 are annealed by an excimer laser to form a polysilicon film. Thereafter, a resist film is formed on the thus-formed polysilicon film. Polysilicon films 124a to 124c are formed as semiconductor films shown in FIG. 14 by using the resist film as a mask for dry etching. Then, the resist film is removed.

Successively, phosphorus (P) ions, n type conductivity impurities are implanted in polysilicon film 124c to be a lower electrode of storage capacitor 119. The phosphorus ions are selectively implanted in polysilicon film 124c, so that a resist film 125 is formed to cover polysilicon films 124a and 124b in a region excluding polysilicon film 124c. Phosphorus ions 129 are implanted in polysilicon film 124c by using resist film 125 as a mask to form a lower electrode 103. The implantation of phosphorus ions 129 forms on resist film 125 a layer 126 of which a property has been changed by the implantation of phosphorus ions (hereinafter referred to as a changed layer 126). On the other hand, the layer underlying resist film 125 has not been affected by the implantation of phosphorus ions 129. Thus, resist film 125 includes two layers, changed layer 126 and unchanged layer 127.

Thereafter, resist film 125 is removed. Note that if a usual stripper is used to remove changed layer 126, the removal requires a considerable time or a changed layer 126 cannot be removed. Thus, plasma ashing with an oxygen plasma is used for the removal of changed layer 126. More specifically, changed layer 126 is removed by directing oxygen plasma 133 to the surface of changed layer 126 of resist film 125, as shown in FIG. 16. After changed layer 126 is removed, a usual stripper is used to remove unchanged layer 127.

Subsequently, insulative film 108 (see FIG. 13) serving as a gate insulative film and a dielectric film of storage capacitor 119 is formed. For example, a silicon oxide film formed by TEOS PECVD may be used as insulative film 108. A chrome film is formed on insulative film 108 by sputtering. A resist film is formed on the chrome film. The chrome film is partially removed by etching using the resist film as a mask, so that gate electrodes 109a, 109b and common electrode 110 (see FIG. 13) are formed. Storage capacitor 119 is formed by common electrode 110, lower electrode 103, and insulative film 108. Then, phosphorus ions producing n type conductivity are implanted into source/drain regions 104a, 104b. P type conductive impurities such as boron (B) ions are implanted into source/drain regions 106a, 106b. This forms p and n channel thin-film field effect transistors 117 and 118.

Then, protective film 111 (see FIG. 13) is formed on gate electrodes 109a, 109b and common electrode 110. A silicon oxide film formed by TEOS CVD may be used as protective film 111. Thereafter, activation is performed by annealing at a temperature of 40° C. A resist film is formed on protective film 111. Protective film 111 and insulative film 108 are partially removed using the resist film as a mask, so that contact holes 112a to 112e are formed. The resist mm is then removed. A chrome film is formed in contact holes 112a to 112e, extending on the surface of protective film 111. The thickness of the chrome film is 100 nm. An aluminum containing alloy film is formed on the chrome film by sputtering. The thickness of the aluminum containing alloy film is 400 nm. A resist film is formed on the aluminum containing alloy film. The aluminum containing alloy film and chrome film are anisotropically etched using the resist film as a mask to form electrodes 113a to 113e (see FIG. 13). The resist film is then removed. Electrodes 13a to 13e are formed by the above mentioned chrome film and the aluminum containing alloy film.

The properties of the thin-film field effect transistor are enhanced and stabilized by hydrogenation of channel regions 105 and 107 with a hydrogen plasma. An insulative film 114 is formed on electrodes 113a to 113e. For example, a silicon nitride film may be used as insulative film 114. Thus, a structure shown in FIG. 13 is obtained.

In the driver circuit region, an n channel thin-film field effect transistor is formed by the above described method in addition to p channel thin-film field effect transistor 117 to form a driver circuit. In the display pixel region, a display pixel is formed by electrically connecting n channel thin-film field effect transistor 118 to a transparent electrode, which is separately formed. Further, the glass substrate with these elements as a semiconductor device is applied to another glass substrate on which a color filter, opposed electrode and the like are formed. Then, a prescribed process is performed including pouring a liquid crystal into the gap between the glass substrates and sealing the gap to provide the liquid crystal display.

As stated above, in the conventional method of manufacturing the liquid crystal display, changed layer 126, which has been changed by implantation of phosphorus ions 129, is formed on resist film 125 when implanting phosphorus ions 129 in the step shown in FIG. 15. For removal of changed layer 126, an oxygen plasma process using an oxygen plasma 113 is performed as shown in FIG. 16.

However, the following problem arises in the oxygen plasma process. Namely, impurities such as phosphorus ions implanted in changed layer 126 of resist film 125 flow to an ambient as changed layer 126 is removed in the oxygen plasma process (an ashing step). Some of the flowing phosphorus ions are again implanted as impurities 136 into polysilicon films 124a, 124b to be channel regions 105, 107 due to an electric field generated in the oxygen plasma process. The re-implanted impurities 136 in polysilicon films 124a, 124b cause the impurity concentrations of channel regions 105, 107 to be higher than a set value. Consequently, a study of the inventors has revealed that the threshold voltages of p and n channel thin-film field effect transistors 117 and 118 change with the impurity concentrations of channel regions 105, 107. The change in threshold voltage will be explained with reference to FIG. 17.

FIG. 17 is a graph showing a relationship between the impurity concentration in the channel region of the thin-film field effect transistor and an amount of change in threshold voltage. FIG. 17 relates to the case where n type conductivity impurities (for example phosphorus ions) are implanted into the channel region of the p channel thin-film field effect transistor. As is apparent from FIG. 17, once the impurity concentration exceeds $10^{16}$ atoms/cm$^3$, there is a sharp rise in threshold voltage, exceeding the set value.

Implantation of the n type conductivity impurities into the channel region of n channel thin-film field effect transistor decreases the threshold voltage. Absolute values of amounts of decrease in threshold voltage are depicted to provide a graph similar to that shown in FIG. 17.

If the threshold voltage of the thin-film field effect transistor changes, the operation of a driver circuit portion utilizing such a thin-film field effect transistor becomes unstable in the liquid crystal display, thereby causing defective products. As a result, yield of liquid crystal displays disadvantageously decreases.

Several methods are contemplated to solve the aforementioned problem. For example, as shown in FIG. 18, insulative films 108 serving as a gate insulative film and dielectric film are preliminary formed on polysilicon films 124a, 124b and lower electrode 103. FIG. 18 is a schematic cross sectional view shown in conjunction with another manufacturing method of a liquid crystal display. As shown in FIG. 18, if insulative film 108 is preliminary formed, in a plasma ashing process using an oxygen plasma as shown in FIG. 16, insulative film 108 is formed on polysilicon films 124a, 124b. Insulative film 108 serves as a protective film for preventing re-implantation of impurities 139 (see FIG. 16) into polysilicon films 124a, 124b. Thus, re-implantation of the impurities such as phosphorus ions into polysilicon films 124a, 124b to be channel regions 105, 107 is prevented.

In this case, however, in the step of implanting phosphorus ions shown in conjunction with FIG. 18, phosphorus ions 129 must be implanted into lower electrode 103 positioned below insulative film 108. This necessitates a greater implantation energy (an acceleration energy) of phosphorus ions 129. If such phosphorus ions accelerated by the great energy are to be implanted into lower electrode 103, insulative film 108 serving as a dielectric film may be damaged by the ion implantation or the conductive impurities such as phosphorus ions 129 are left in insulative film 108. If insulative film 108 is damaged, the breakdown voltage of insulative film 108 is decreased. As a result, the durability and reliability of storage capacitor 119 decreases. Further, if the acceleration energy of phosphorus ions 129 is high as described above, changed layer 126 of resist film 125 expands and its properties are changed to a larger extent. Thus, resist film 125 cannot be well removed in the step of removing resist film 125. Such poor removal of resist film 125 prevents formation of p and n channel thin-film field effect transistors 117 and 118 in a prescribed manner, thereby resulting in poor operation of the thin-film field effect transistor. Consequently, the yield of liquid crystal displays decreases.

In addition, generally, impurities of about $10^{20}$ atoms/cm$^3$ must be implanted into lower electrode 103. In this case, a certain amount of impurities are implanted also into insulative film 108 positioned on lower electrode 103. The concentration of the impurities to be implanted into insulative film 108 would be at least about $10^{18}$ atoms/cm$^3$, judging from the data shown in FIG. 19. FIG. 19 is a graph showing a relationship between a depth of a target material from an implantation surface and a boron concentration in that position when boron ions are used as impurity ions and implanted into a target material of silicon. The graph of FIG. 19 shows a result when an implantation energy of the boron ions is varied. Referring to FIG. 19, if, for example, the boron ions are implanted under a condition of the implantation energy of $4.8 \times 10^{-15}$J (30 keV), the boron concentration in the position about 0.1 µm from the surface of the implantation surface is $10^{20}$ atoms/cm$^3$. Then, the boron concentration is about $10^{19}$ atoms/cm$^3$ in the surface layer (in the position with a depth of 0 µm) of silicon. If the implantation energy of the boron ions is varied under a condition of the boron concentration of about $10^{20}$ atoms/cm$^3$ in the region with the highest boron concentration, the boron concentration in the surface layer of the target material is at least about $10^{18}$ atoms/cm$^3$.

Judging from the above, phosphorus ions 129 would be included in a concentration of about $10^{18}$ atoms/cm$^3$ in insulative film 108 on the upper surface (corresponding to the surface layer) of lower electrode 103, which is a target material into which phosphorus ions 129 of the conductive impurities are implanted. Namely, when the step of implanting phosphorus ions 129 is performed with insulative film 108 preliminary formed as a protective film, impurity ions of about $10^{18}$ atoms/cm$^3$ would be implanted into insulative film 108 on lower electrode 103. Such residual conductive impurities in the dielectric film causes a decrease in durability and reliability of storage capacitor 119. The data of FIG. 19 is derived from "Ultra LSI Process Data Handbook," SCIENCE FORUM, Mar. 31, 1990, p232. In FIG. 19, 50 keV, 70 keV, 100 keV, and 200 keV respectively represent $8.0 \times 10^{15}$J, $1.1 \times 10^{14}$J, $1.6 \times 10^{14}$J, and $3.2 \times 10^{14}$J.

Another possible method of solving the problem will be described below, which is associated with the re-implantation of impurities such as phosphorus ions into polysilicon films 214a, 124b to be channel regions 105, 107. FIG. 20 is a schematic cross sectional view showing another exemplary liquid crystal display manufactured by the method described below. Referring to FIG. 20, the liquid crystal display basically has the same structure as the conventional liquid crystal display shown in FIG. 13. However, an insulative film serving as a gate insulative film and a dielectric film of storage capacitor 119 has a 2-layer structure of lower and upper insulative films 137 and 138.

FIGS. 21 and 22 are schematic cross sectional views shown in conjunction with the manufacturing method of the liquid crystal display of FIG. 20. The manufacturing method of the semiconductor device will be described with reference to FIGS. 21 and 22.

The step shown in FIG. 21 is basically the same as that of FIG. 18. Note that formed on polysilicon films 124a, 124b and lower electrode 103 is lower insulative film 137 as a protective film, which is smaller than insulative film 108 in thickness. After phosphorus ions 129 are implanted with lower insulative film 137 as such a thin protective film formed, resist film 125 is removed by, for example, plasma ashing. Thereafter, upper insulative film 138 is formed on lower insulative film 137 as shown in FIG. 22. A total thickness of lower and upper insulative films 137 and 138 is adjusted to be approximately equal to a thickness required for the gate insulative film of p and n type thin-film field effect transistors 117 and 118.

As shown in FIG. 21, since lower insulative film 137 is used as a protective film which is smaller than insulative film 108 of FIG. 18 in thickness, the implantation energy of phosphorus ions 129 is lower than in the step shown in FIG. 18. As a result, damage to insulative film 108 caused by the implantation of the phosphorus ions in the step of FIG. 18 can be, to some extent, reduced.

However, if the step shown in FIGS. 21 and 22 are employed, the greater number of steps are necessary than in the manufacturing method of FIG. 18. Further, if the gate insulative film has two layers as shown in FIG. 22, it is known that the breakdown voltage and reliability become lower than when the gate insulative film has a single film. As a result, yield of liquid crystal display decreases due to reduction in breakdown voltage and reliability of p and n channel thin-film field effect transistors 117 and 118 as well as storage capacitor 119.

As described above, in the semiconductor device provided with a conductive layer formed by the same layer as the channel region of the thin-film field effect transistor, conventionally, it is difficult to stabilize the threshold voltage by preventing re-implantation of impurities into the channel region of the thin-film field effect transistor while ensuring sufficient durability and reliability of the storage capacitor including lower electrode 103 as the conductive layer.

SUMMARY OF THE INVENTION

One object of the present invention is to provide a semiconductor device provided with a thin-film field effect transistor and a conductive layer and manufacturing method thereof capable of stabilizing a threshold voltage of the thin-film field effect transistor while enhancing durability and reliability of the capacitor of which conductive layer is used as an electrode.

Another object of the present invention is to provide a liquid crystal display provided with a thin-film field effect transistor and a conductive layer and a manufacturing method thereof capable of stabilizing a threshold voltage of the thin-film field electrode transistor while enhancing durability and reliability of a capacitor of which conductive layer is used as an electrode.

A semiconductor device according to one aspect of the present invention is provided with a thin-film field effect transistor and a conductive layer and also includes a substrate, a semiconductor film, a conductive layer, and a dielectric film. The semiconductor film includes a channel region of the thin-film field effect transistor formed on the substrate. The conductive layer is originally formed on the substrate in the same layer as the semiconductor film. The dielectric film is formed on the conductive layer. A conductive impurity concentration of the channel region is at most $10^{16}$ atoms/cm$^3$. A conductive impurity concentration of the dielectric film is at most $10^{17}$ atoms/cm$^3$.

As stated above, since the conductive impurity concentration of the channel region of the thin-film field effect transistor is at most $10^{16}$ atoms/cm$^3$, the threshold voltage of the thin-film field effect transistor would not change.

In addition, since the conductive impurity concentration of the dielectric film is at most $10^{17}$ atoms/cm$^3$, reduction in breakdown voltage and reliability of the dielectric film is prevented. Thus, if a capacitor is formed having as one electrode a conductive layer and the other electrode as one conductive layer opposite to the conductive layer of one electrode through the dielectric film, durability and reliability of the capacitor can be enhanced. When the conductive impurities are implanted into the conductive layer through the dielectric film after formation of the dielectric film, the conductive impurity concentration of the dielectric film becomes at least $10^{18}$ atoms/cm$^3$ as described above. Thus, if the conductive impurity concentration of the dielectric film is to be at most $10^{17}$ atoms/cm$^3$, the conductive impurities must be implanted into the conductive layer with no dielectric film formed. Namely, damage to the dielectric film due to implantation of the conductive impurities can be prevented.

In the semiconductor device according to the above described one aspect, the thin-film field effect transistor has source and drain regions of a first conductivity type. Preferably, the conductive impurities have a second conductivity type opposite to the first conductivity type.

Here, if the conductive impurities in the channel region is of the second conductivity type, the threshold voltage of the thin-film field effect transistor increases with increase in conductive impurity concentration. With the conductive impurity concentration of the channel region set in a range defined by the present invention, it is ensured that the threshold voltage of the thin-film field effect transistor would not exceed a set value.

In the semiconductor device according to the above mentioned one aspect, the thin-film field effect transistor has source and drain regions of a first conductivity type, and the conductive impurities may have the first conductivity type.

In this case, it is ensured that the threshold voltage of the thin-film field effect transistor would not fall below a set value because of the presence of the conductive impurities.

A liquid crystal display according to another aspect of the present invention is provided with a semiconductor device according to the above mentioned one aspect.

Thus, the thin-film field effect transistor is applied to a switching element in the display pixel region of the liquid crystal display and the conductive layer is applied to the electrode of the storage capacitor of the pixel to easily stabilized the threshold voltage of the thin-film field effect transistor in the display pixel region while enhancing durability and reliability of the storage capacitor. As a result, a display property of the liquid crystal display can be enhanced.

In the manufacturing method of the semiconductor device provided with the thin-film field effect transistor and the conductive layer according to another aspect of the present invention, a semiconductor film is formed on the substrate. A first resist film is formed on the semiconductor film. The semiconductor film is etched by using the first resist film as a mask to form first semiconductor film to be a channel region of the thin-film field effect transistor and second semiconductor film. The first resist film is removed. A second resist film is formed at least on the first semiconductor film in a region excluding the second semiconductor film. Conductive impurities are implanted into the second semiconductor film using the second resist film as a mask to form a conductive layer. The second resist film is removed by ultraviolet light irradiation or wet etching. A dielectric film is formed on the conductive layer after formation of the conductive layer.

In this method, plasma ashing using for example an oxygen plasma is not employed for removal of the second resist film, so that it is ensured that the conductive impurities left in the resist would not be implanted into the first semiconductor film to be the channel region of the thin-film field effect transistor. This prevents unnecessary increase in the conductive impurity concentration of the first semiconductor film, whereby the threshold voltage of the thin-film field effect transistor having the first semiconductor film as the channel region would not change.

Since the dielectric film is formed after formation of the conductive layer, damage to the dielectric film due to implantation of the conductive impurities can be prevented. As a result, durability and reliability of the dielectric film can be enhanced. This enhances breakdown voltage and reliability of a capacitor or the like formed by using the dielectric film.

In the manufacturing method of the semiconductor device according to the above mentioned another aspect, the second resist film may include a lower layer portion and an upper layer portion thereon. The step of removing the second resist film preferably includes a step of removing the upper layer portion by ultraviolet light irradiation and a step of removing the lower layer portion by wet etching.

In this case, it is ensured that the upper layer portion including a portion of which property has been changed due to implantation of the conductive impurities can be removed by ultraviolet light irradiation and a lower layer portion can be removed in a relatively short time by wet etching. This avoids the problem associated with the left portion of the changed layer and shortens the time required for manufacturing the semiconductor device.

In the manufacturing method of the semiconductor device according to the above mentioned another aspect, prior to the step of forming the second resist film, preferably, a protective film is formed on the first semiconductor film and the protective film is removed after the step of removing the second resist film. The step of removing the second resist film is preferably performed with the protective film left.

In this case, it is ensured that the protective film prevents implantation of the conductive impurities left in the second resist film into the first semiconductor film in the step of removing the second resist film. As a result, unnecessary increase in the conductive impurity concentration of the first semiconductor film can be prevented.

In the manufacturing method of a semiconductor device provided with a thin-film field effect transistor and a conductive layer according to another aspect of the present invention, a semiconductor film is formed on a substrate. A first resist film is formed on the semiconductor film. The semiconductor film is etched by using the first resist film as a mask to form first and second semiconductor films to be channel regions of the thin-film field effect transistor. A protective film is formed on the first semiconductor film. A second resist film is formed at least on the protective film in a region excluding the second semiconductor film. Conductive impurities are implanted into the second semiconductor film using the second resist film as a mask to form a conductive layer. The second resist film is removed with the protective film left after formation of the conductive layer. The protective film is removed. After the removal of the protective film, a dielectric film is formed on the conductive layer.

In this method, it is ensured that implantation of the conductive impurities left in the second resist film into the first protective film can be prevented because of the presence of the protective film in the step of removing the second resist film. As a result, unnecessary increase in the conductive impurity concentration of the first semiconductor film can be avoided. Thus, it is ensured that the conductive impurity concentration of the channel region of the thin-film field effect transistor does not exceed a prescribed value, whereby the threshold voltage of the thin-film field effect transistor would not change.

Further, subsequent to the removal of the protective film, i.e., after implantation of the conductive impurities, damage to the dielectric film due to implantation of the conductive impurities is prevented because the dielectric film is formed on the conductive layer. Accordingly, reduction in breakdown voltage or reliability of the dielectric film caused by the damage to the dielectric film is prevented. Thus, durability and reliability of an element such as a capacitor with the dielectric film can be enhanced.

In the manufacturing method of a semiconductor device provided with a thin-film field effect transistor and a conductive layer according to still another aspect of the present invention, a semiconductor film is formed on a substrate. A coating to be a protective film is formed on the semiconductor film. A first resist film is formed on the coating. The semiconductor film and the coating are etched and removed by using the first resist film as a mask to form first semiconductor film to be a channel region of the thin-film field effect transistor, second semiconductor film and a protective film on the first and second semiconductor films. A second resist film is formed at least one the protective film in a region excluding the second semiconductor film. Conductive impurities are implanted into the second semiconductor film by using the second resist film as a mask to form a conductive layer. After the step of forming the conductive layer, the second resist film is removed with the protective film still left. Then the protective film is removed. After the removal of the protective film, a dielectric film is formed on the conductive layer.

In this method, the second resist film is removed with the protective film still left, implantation of the conductive impurities left in the second resist film into the first semiconductor film can be avoided. Thus, unnecessary increase in the conductive impurity concentration of the channel region of the thin-film field effect transistor can be prevented.

Further, the dielectric film is formed subsequent to the removal of the protective film, i.e., after implantation of the conductive impurities, damage to the dielectric film caused by the implantation of the conductive impurities is avoided. Thus, the quality of the dielectric film would not be impaired, whereby breakdown voltage and reliability of the dielectric film can enhanced. As a result, durability and reliability of an element such as a capacitor with the conductive layer and the dielectric film can be enhanced.

In the manufacturing method of a semiconductor device according to the above described another aspect or still another aspect, the step of removing the second resist film preferably includes a step of removing an upper layer portion including an upper surface of the second resist film by plasma ashing, and a step of removing a lower layer portion of the second resist film under the upper layer portion by wet etching.

In this case, it is ensured that the upper layer portion including a region (changed layer) of which property has been changed by the implantation of the conductive impurities is removed by plasma ashing. At the same time, since the lower layer portion is removed by wet etching, the problem associated with the left portion of the changed layer is avoided. In addition, wet etching shortens the manufacturing time.

In the manufacturing method of the semiconductor device according to the above described another aspect or still another aspect, the upper layer portion of the second resist film is preferably a changed layer which has been subjected to implantation of conductive impurities.

In this case, it is ensured that the changed layer is removed by plasma ashing. Thus, a defect would not be caused to the structure of the thin-film field effect transistor due to the left unchanged layer.

In the manufacturing method of the semiconductor device according to the above described another aspect or on of still another aspects, preferably, the protective film is an oxide film or a nitride film.

In this case, the protective film can easily be formed by CVD (Chemical Vapor Deposition), thermal oxidation, or ultraviolet light irradiation, which has conventionally been employed for the manufacturer of the semiconductor devices. This eliminates the need for an investment involving introduction of a manufacturing device for forming the protective film. Thus, the manufacturing cost of the semiconductor device would not be increased.

In the manufacturing method of the semiconductor device according to the above described another aspect or one of still another aspects, preferably, the protective film is formed by CVD or sputtering.

In this case, by adjusting conditions of the CVD or the like, the protective film can easily be adjusted to have an arbitrary thickness.

If CVD is used in the step of forming the first semiconductor device, formation of the continuous protective film simplifies the process.

In the manufacturing method of the semiconductor device according to the above described another aspect or one of still another aspects, the protective film may be formed by ultraviolet light irradiation.

In this case, the protective film can be formed by a simple and time-saving process such as ultraviolet light irradiation, whereby the manufacturing process is simplified and completed in a shorter time.

The manufacturing method of the liquid crystal display according to still another aspect of the present invention employs the manufacturing method of the semiconductor device according to the above described another aspect or one of still another aspects.

Thus, if the thin-film field effect transistor is used as a circuit element in the display pixel region of the liquid crystal display and the conductive layer is used as an electrode of a storage capacitor in the display pixel region, the threshold voltage of the thin-film field effect transistor in the display pixel region is stabilized and durability and reliability of the capacitor can be enhanced. This enhances the display property of the liquid crystal display.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11 and 12 are schematic cross sectional views respectively shown in conjunction with the first and second steps of the manufacturing method of a third embodiment of the liquid crystal display of the present invention.

DESCRIPTION OF THE PREFERRED EMBODIMENTS

Figure 1:
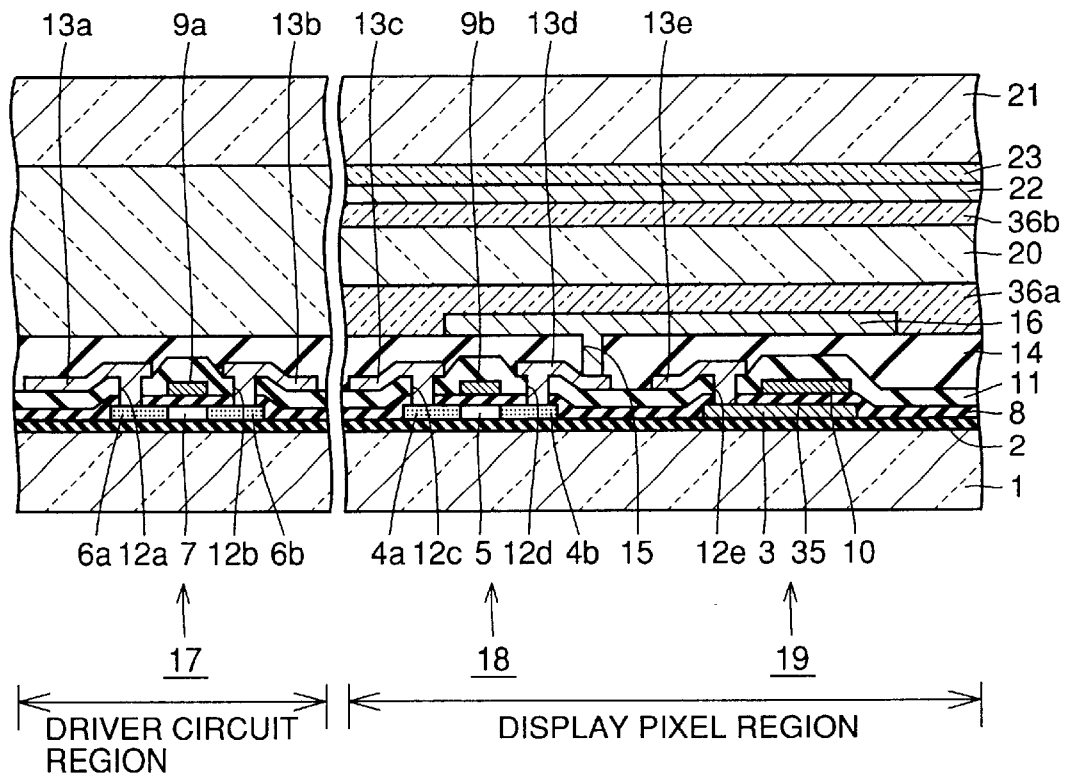
FIG. 1 is a schematic cross sectional view showing a first embodiment of the liquid crystal display according to the present invention.

Now, embodiments of the present invention will be described with reference to the drawings. It is noted that the same or corresponding portions throughout the drawings are denoted by the same reference numerals, and therefore description thereof will not be repeated.

First Embodiment

Referring to FIG. 1, a liquid crystal display will be described.

Referring to FIG. 1, the liquid crystal display includes a glass substrate 1, an upper glass substrate 21, and a liquid crystal 20 between glass substrate 1 and upper glass substrate 21. A base film 2 is formed on glass substrate 1. In a driver circuit region of glass substrate 1, a p type thin-film field effect transistor 17 is formed on base film 2. P type thin-film field effect transistor 17 includes source/drain regions 6a, 6b, a channel region 7, an insulative film 8 serving as a gate insulating film, and a gate electrode 9a.

Formed on base film 2 are source/drain regions 6a, 6b formed by the same layer of semiconductor film and a channel region 7. P type conductive impurities such as boron (B) are implanted into source/drain regions 6a, 6b. An insulating film 8 serving as a gate insulating film is formed on channel region 7. In the region on channel region 7, a gate electrode 9a of a chrome film is formed on insulative film 8. A protective film 11 of a silicon oxide film is formed on gate electrode 9a and insulative film 8. In the region on source/drain regions 6a, 6b, protective film 11 and insulative film 8 are partially removed to form contact holes 12a, 12b. Electrodes 13a, 13b are respectively formed in contact holes 12a, 12b extending on protective film 22. An insulative film 14 is formed on electrodes 13a, 13b and protective film 11.

In a display pixel region of glass substrate 1, base film 2 is formed on glass substrate 1 as described above. On base film 2, n type thin-film field effect transistor 18 and a storage capacitor 19 are formed. N type thin-film field effect transistor 18 includes source/drain regions 4a, 4b, a channel region 5, an insulative film 8 serving as a gate insulative film, and a gate electrode 9b. On base film 2, source/drain regions 4a, 4b and channel region 5 are formed by the same layer of semiconductor film. N type conductive impurities such as phosphorus (P) ions are implanted into source/drain regions 4a, 4b. Insulative film 8 serving as a gate insulative film is formed on channel region 5. In the region on channel region 5, a gate electrode 9b is formed on insulative film 8. As in the driver circuit region, protective film 11 is formed on gate electrode 9b and insulative film 8. On source/drain regions 4a, 4b, protective film and insulative film 8 are partially removed to form contact holes 12c, 12d. Electrodes 13c, 13d are respectively formed in contact holes 12c, 12d extending on the surface of protective film 11.

On base film 2, a lower electrode 3 is formed as a conductive layer originally formed in the same layer as the semiconductor film forming source/drain regions 4a, 4b and channel region 5. Insulative film 8 as a dielectric film is formed on lower electrode 3. Insulative film portion 35 positioned on lower electrode 3 serves as a dielectric film of a capacitor. A common electrode 10 is formed on insulative film portion 35. Protective film 11 is formed on common electrode 10 and insulative film 8. In the region on lower electrode 3, protective film 11 and insulative film 8 are partially removed to form a contact hole 12e. An electrode 13e is formed in contact hole 12e extending on protective film 11. An insulative film 14 is formed on electrode 13e and protective film 11.

In the region on electrode 13d, a contact hole 15 is formed in insulating film 14. An ITO (Indium Tin Oxide) pixel electrode 16 electrically connected to electrode 13a is formed in contact hole 15 to extend on insulative film 14. An orientation film 36a is formed on ITO pixel electrode 16 and insulative film 14.

Upper glass substrate 21 is placed above glass substrate 1 on a side opposite to that with p and n type thin-film field effect transistors 17 and 18 as well as storage capacitor 19. A color filter 23 is applied to the surface of upper glass substrate 21 opposite to glass substrate 1. An opposed electrode 22 is formed on the surface of color filter 23 opposite to glass substrate 1. An orientation film 36b is formed on the surface of electrode 22 opposite to glass substrate 1. Liquid crystal 20 is held between orientation films 36a and 36b.

Figure 17:
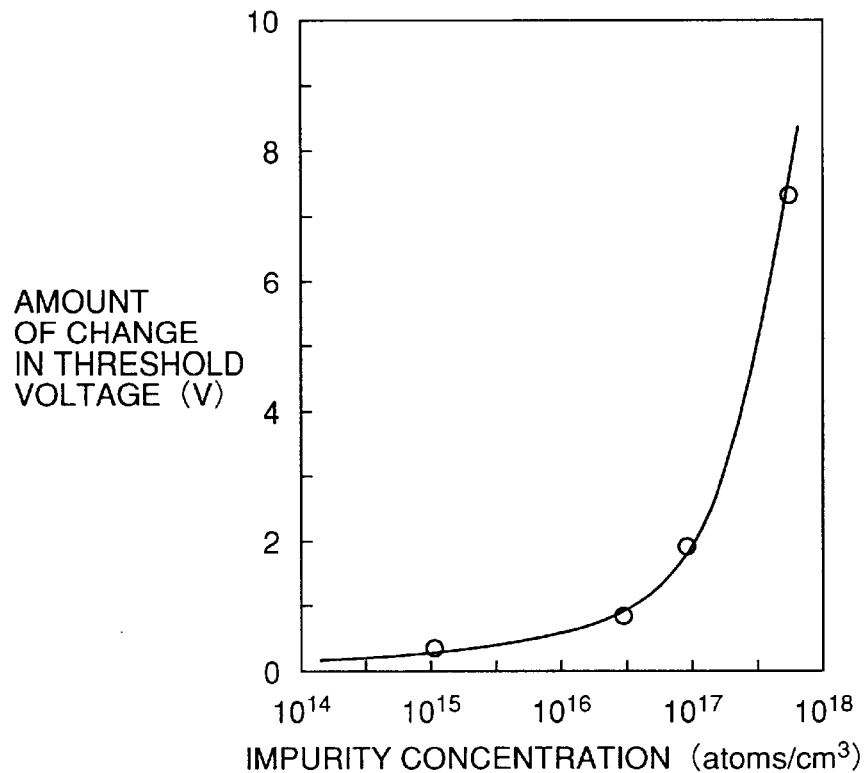
FIG. 17 is a graph showing a relationship between impurity concentration of a channel region of the thin-film field effect transistor and an amount of change in threshold voltage.
Figure 18:
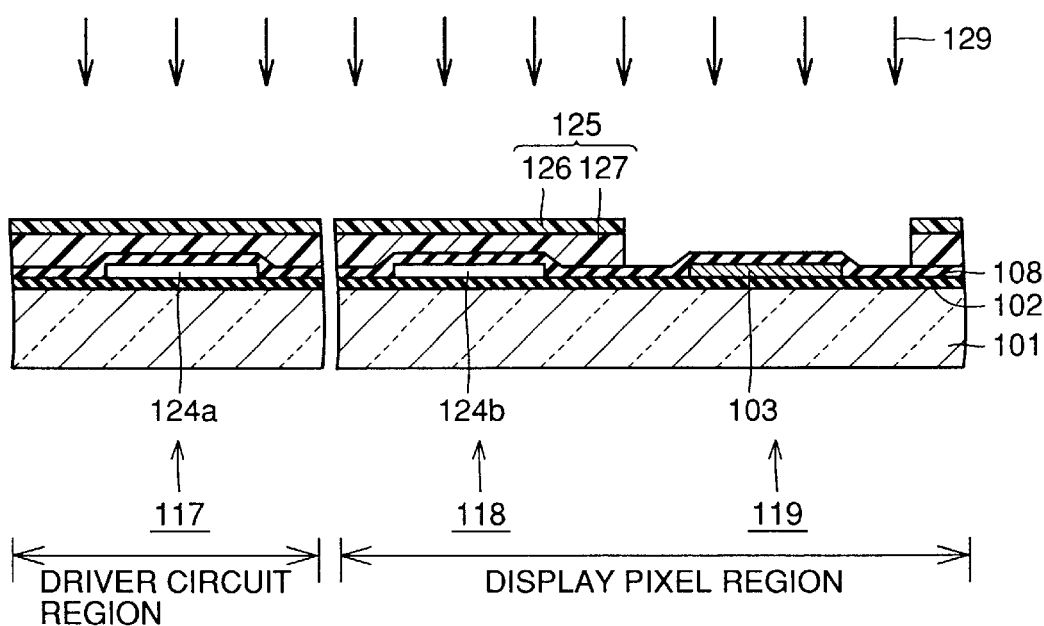
FIG. 18 is a schematic cross sectional view shown in conjunction with another manufacturing method of a liquid crystal display.

Here, the concentrations of the n type conductive impurities of channel regions 7 and 5 are both at most $10^{16}$ atoms/cm$^3$. With the impurity concentration of at most $10^{16}$ atoms/cm$^3$, the threshold voltage of the field effect transistor would not significantly deviate from a set value, as is apparent from the graph of FIG. 17. From FIG. 17, when the conductive impurity concentration of channel regions 5 and 7 exceeds $10^{16}$ atoms/cm$^3$, there is a sharp rise in threshold voltage. It is noted that a similar effect can be produced if the concentration of channel regions 7 and 5 is at most $10^{16}$ atoms/cm$^3$ for p type conductive impurities.

Figure 19:
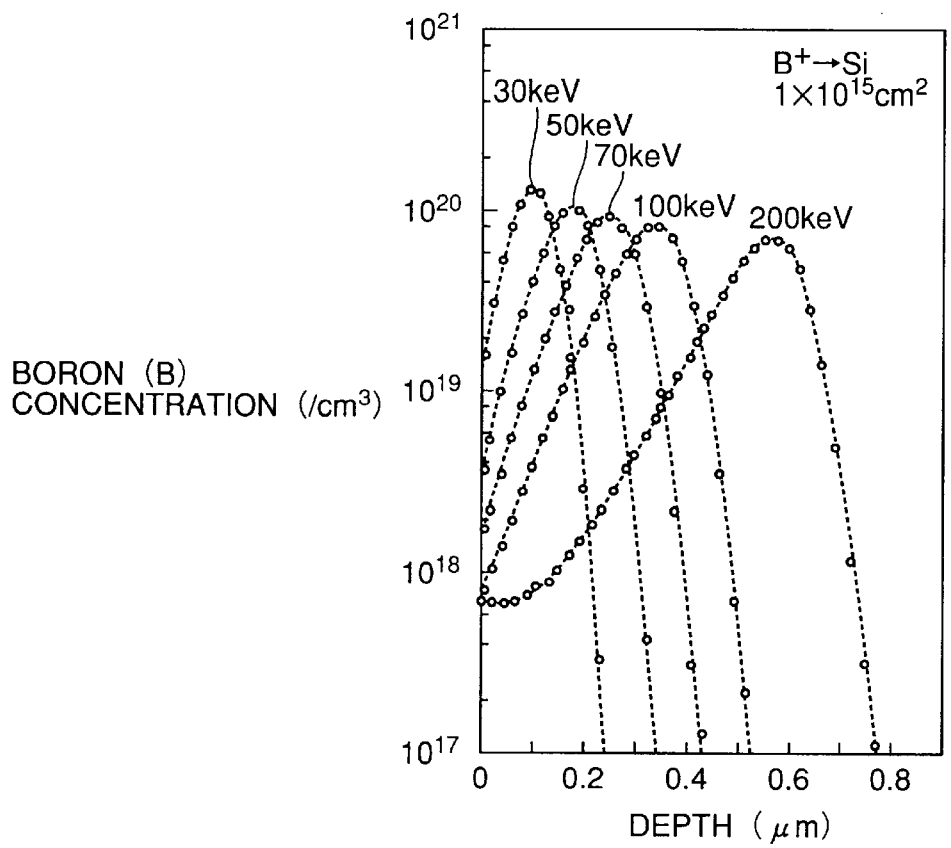
FIG. 19 is a graph showing a relationship between a depth of a target material from an implantation surface and a boron concentration when boron ions are implanted into the target material including silicon.
Figure 20:
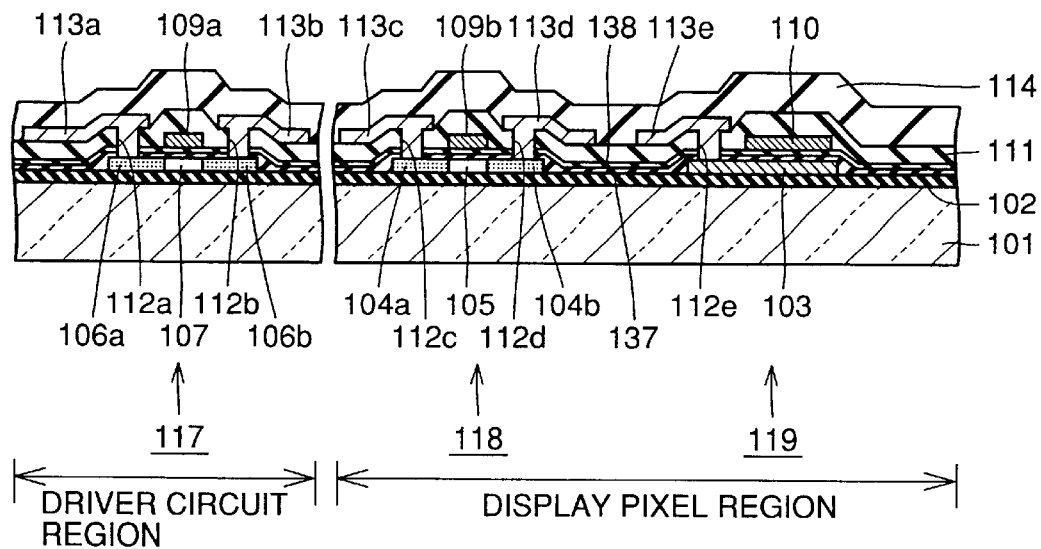
FIG. 20 is a schematic cross sectional view showing another exemplary liquid crystal display.
Figure 21:
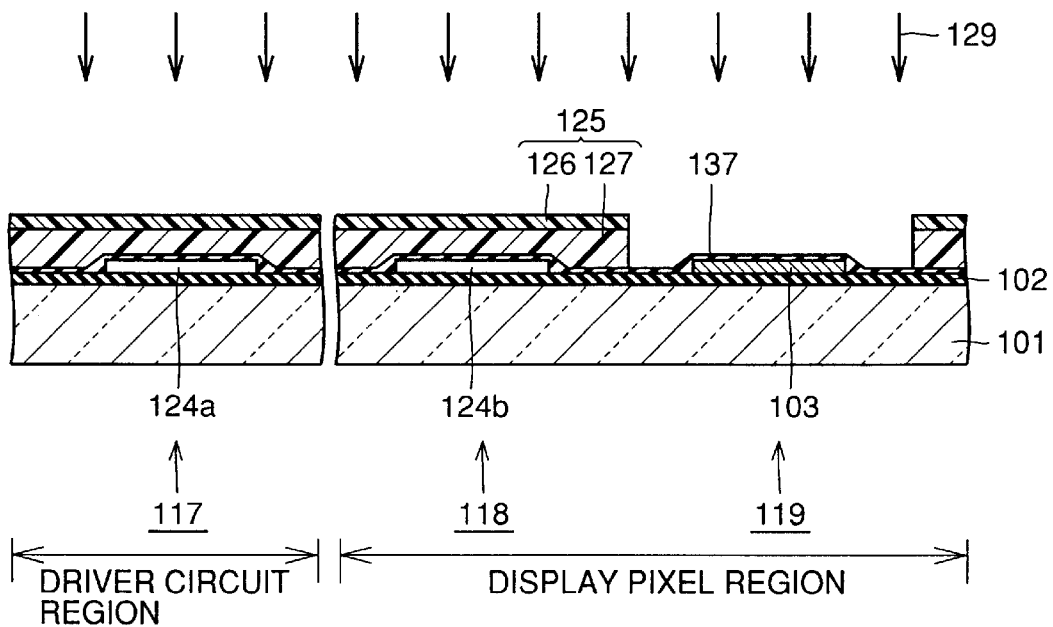
FIGS. 21 and 22 are schematic cross sectional views respectively shown in conjunction with the first and second steps of the manufacturing method of the liquid crystal display shown in FIG. 20.
Figure 22:
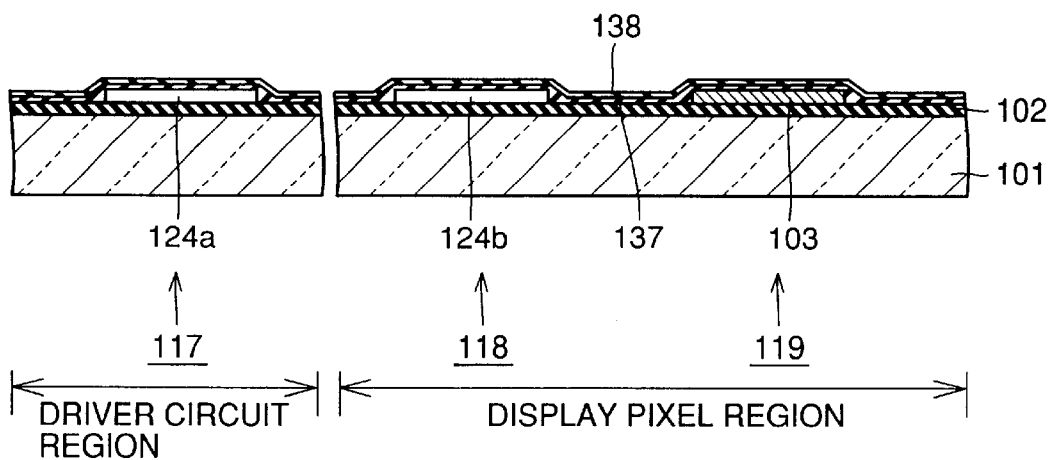

The concentration of the n type conductive impurities of insulative film portion 35 of a capacitor is at most $10^{17}$ atoms/cm$^3$. This is because the conductive impurity concentration can be kept relatively low as insulative film portion 35 is formed after implantation of the conductive impurities into lower electrode 3, as will be later explained in conjunction with the manufacturing method. With such conductive impurity concentration, it is ensured that the breakdown voltage or reliability of insulative film portion 35 as a dielectric film would not decrease because of the presence of the conductive impurities. If insulative film portion 35 is preliminary formed prior to implantation of the conductive impurities into lower electrode 3, it is difficult to achieve such a relatively low impurity concentration for insulative film portion 35. This is also supported by the data of FIG. 19. To achieve such impurity concentration, as will later be described in conjunction with the manufacturing method, insulative film portion 35 must be formed after the implantation of the conductive impurities into lower electrode 3. This prevents damage to insulative film portion 35 due to implantation of the conductive impurities. As a result, it is ensured that the problem associated with reduction in breakdown voltage or reliability of insulative film portion 35 is avoided. Note that, if insulative film portion 35 is preliminary formed in the step of implanting the conductive impurities into lower electrode 3, the conductive impurity concentration of insulative film portion 35 exceeds $10^{17}$ atoms/cm$^3$, as seen from FIG. 19. In this case, damage is caused to insulative film portion 35 due to implantation of the conductive impurities, whereby the breakdown voltage or the like of insulative film portion 35 decreases.

Further, p type conductive impurities such as boron ions are implanted into source/drain regions 6a, 6b in p type thin-film field effect transistor 17. If n type conductive impurities such as phosphorus ions implanted into lower electrode 3 are implanted into channel region 7, the threshold voltage of p type thin-film field effect transistor 17 increases. However, with the concentration of the phosphorus ions of channel region 7 kept at most $10^{16}$ atoms/cm$^3$ as described above, the rise of the threshold voltage is reliably prevented.

For n type thin-film field effect transistor 18, phosphorus ions of n type conductive impurities are implanted into source/drain regions 4a, 4b. If the phosphorus ions implanted into lower electrode 3 are re-implanted into channel region 5, the threshold voltage of n type thin-film field effect transistor 18 decreases. However, with the concentration of phosphorus ions of channel region 5 kept at most $10^{16}$ atoms/cm$^3$ as described above, the decrease in the threshold voltage is reliably prevented.

Thus, according to the present invention, it is ensured that the threshold voltage of the thin-film field effect transistor in the driver circuit region and display pixel region would not change and durability and reliability of storage capacitor 19 can be enhanced in the liquid crystal display.

Referring to FIGS. 2 to 7, the manufacturing method of the liquid crystal display will be described.

First, a base film 2 is formed on glass substrate 1 for example by PECVD. A 2-layer film of a silicon nitride film and a silicon oxide film is used as base film 2. An amorphous silicon film (not shown) is continuously formed on base film 2. The amorphous silicon film is annealed by an excimer laser to form a polysilicon film. A resist film (not shown) is formed on the polysilicon film. The polysilicon film is partially removed by dry etching using the resist film as a mask to form polysilicon films 24a to 24c (see FIG. 2) as the first and second semiconductor films. Thereafter, the resist film is removed. This forms a structure shown in FIG. 2.

Figure 3:
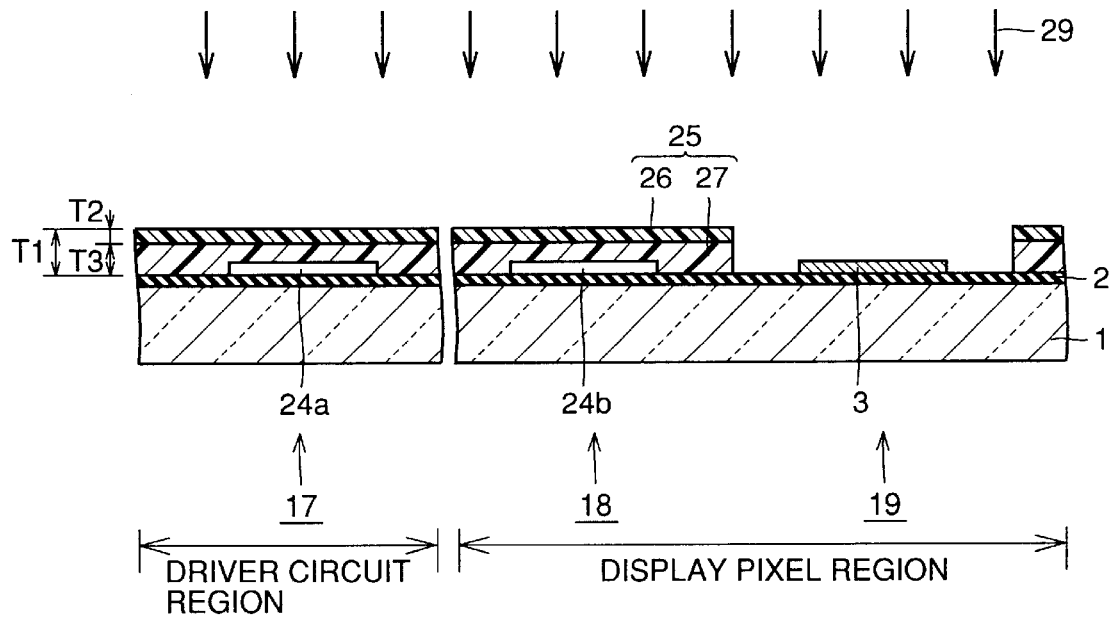

Then, a resist film 25 (FIG. 3) is formed on polysilicon films 24a, 24b as the first semiconductor film in a region excluding polysilicon film 24c as a second semiconductor film to be lower electrode 3 (FIG. 1). A thickness T1 (FIG. 3) of resist film 25 is about 1.3 µm. As shown in FIG. 3, phosphorus ions 29 are implanted into polysilicon film 24c under a condition of about $1.60 \times 10^{-15}$J (10 keV). Such implantation of phosphorus ions forms on resist film 25 a changed layer 26 of which property has been changed by the implantation of phosphorus ions. A thickness of changed layer 26 is T2. An unchanged layer 27 which has not been damaged by the implantation of phosphorus ions is positioned under changed layer 26. A thickness of unchanged layer 27 is T3. The implantation of phosphorus ions 28 forms lower electrode 3 as shown in FIG. 3.

Figure 4:
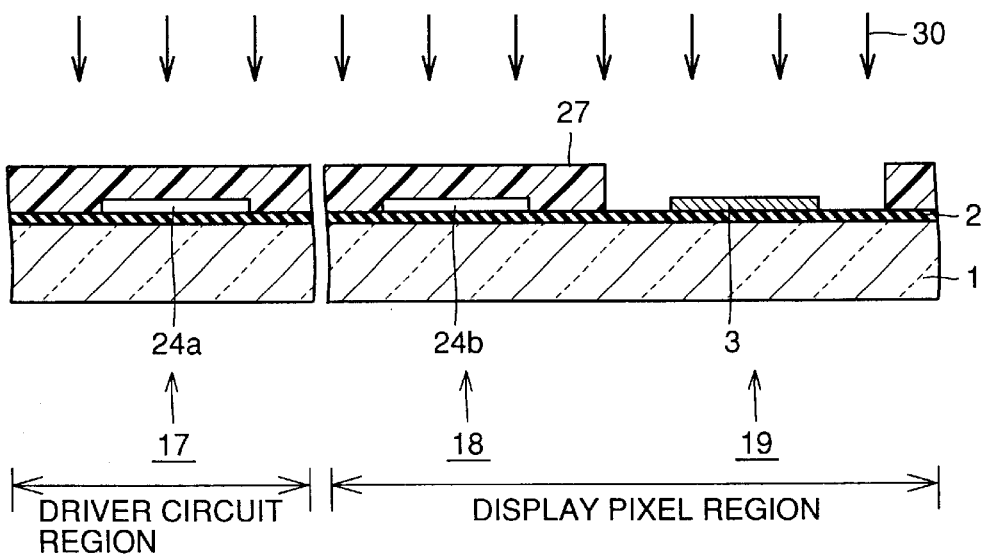

Referring to FIG. 4, changed layer 26 is removed by irradiation of ultraviolet light 30. Excimer UV with a wavelength of 172 nm is used as ultraviolet light 30. The process conditions are as follows. A lamp illumination intensity is 10 m W/cm$^2$, a temperature of a glass substrate is 130° C., and a distance between the lamp and the glass substrate 1 is 3 mm. A speed of removing the resist is about 400 nm/min. Thus, the irradiation time of excimer UV is about two to three minutes to enable removal of resist film 25 having a thickness T1 of about 1.3 µm. Unchanged layer 27 is also removed by irradiation of ultraviolet light in this way.

Note that resist film 25 may be removed by a wet process instead of irradiation of ultraviolet light. In this case, for example, a mixture of strong sulfuric acid and hydrogen peroxide heat to 95° C. is used as a treatment agent.

A general stripper may be used to remove resist film 25.

After changed layer 26 is removed mainly by irradiation of ultraviolet light, unchanged layer 27 may be removed by the wet treatment. Thus, a combination of ultraviolet light irradiation and wet treatment may be employed to remove resist film 25. This shortens the time required for removing resist film 25 as compared with the case of removing changed and unchanged layers 26 and 27 only by ultraviolet light irradiation.

Since plasma ashing is not used for removal of resist film 25, phosphorus ions left in resist film 25 during plasma ashing is prevented from being re-implanted into polysilicon films 24a, 24b to be channel regions 5, 7 (FIG. 1) as in the conventional example. As a result, the threshold voltage of p and n type thin-film field effect transistors 17 and 18 would not change due to the re-implanted phosphorus ions.

Figure 5:
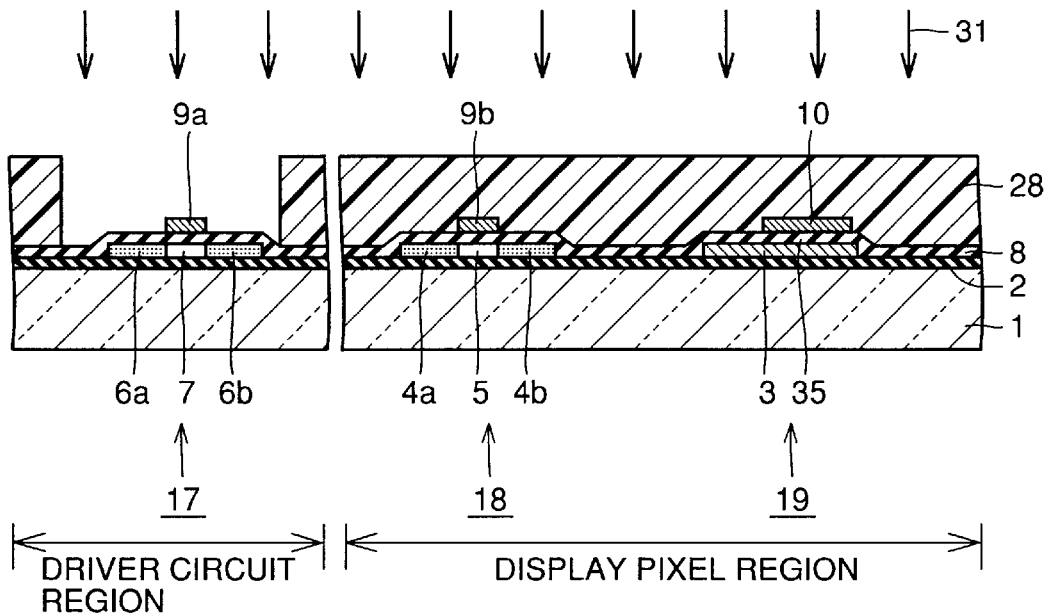

Then, insulative film 8 (FIG. 5) serving as the gate insulative film of the thin-film field effect transistor and a dielectric film of storage capacitor 19 is formed for example by TEOS PECVD. A silicon oxide film is used as insulative film 8. A thickness of insulative film 8 is about 70 nm. Then, a chrome film is formed on insulative film 8 by sputtering or the like. A resist film (not shown) is formed on the chrome film. The chrome film is partially etched and removed using the resist film as a mask to form gate electrodes 9a, 9b and a common electrode 10 as shown in FIG. 5. Common electrode 10 (also referred to as a common interconnection), lower electrode 3, and insulative film portion 35 of insulative film 8 comprise storage capacitor 19. Then, a region excluding polysilicon film 24b (FIG. 4) is covered with a resist film and phosphorus ions are implanted into polysilicon film 24b using gate electrode 9b as a mask. This forms source/drain regions 4a, 4b (FIG. 5) and a channel region (FIG. 5). The resist film is then removed. A resist film 28 is formed in a region excluding polysilicon film 24a as shown in FIG. 5. Boron ions 31 are implanted into polysilicon film 24a using gate electrode 9a as a mask. This forms source/drain regions 6a, 6b and channel region 7.

Insulative film 8 including insulative film portion 35 of storage capacitor 19 is formed after implantation of phosphorus ions 29 shown in FIG. 3. Thus, damage to insulative film portion 35 caused by the implantation of phosphorus ions 29 of FIG. 3 is prevented. Accordingly, it is ensured that a problem associated with reduction in breakdown voltage or reliability of insulative film portion 35 is avoided. As a result, durability and reliability of storage capacitor 19 can be enhanced.

Figure 6:
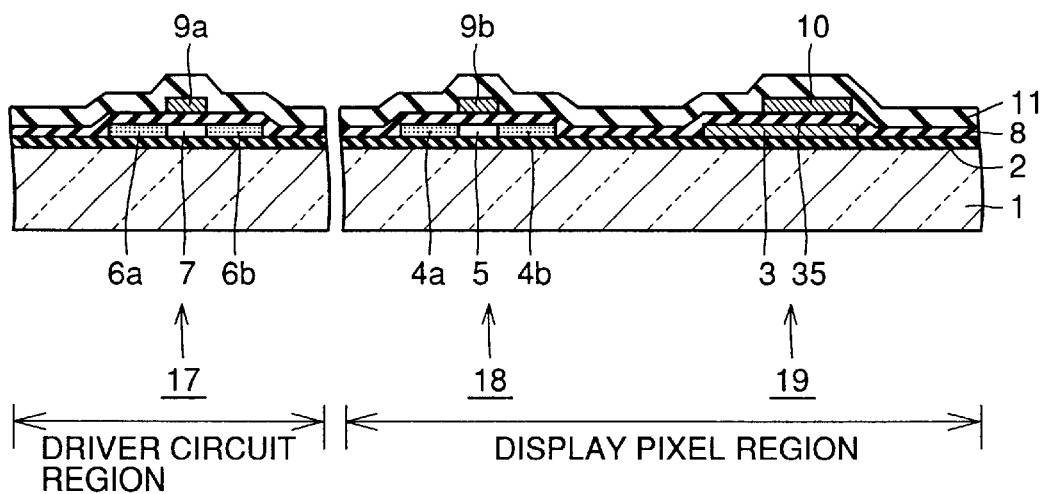

After the removal of resist film 28 in FIG. 5, protective film 11 is formed on gate electrodes 9a, 9b and common electrode 10, as shown in FIG. 6. A silicon oxide film formed by TEOS PECVD may be used as protective film 11. After protective film 11 is formed, activation is performed by annealing at a temperature of 400° C.

Figure 7:
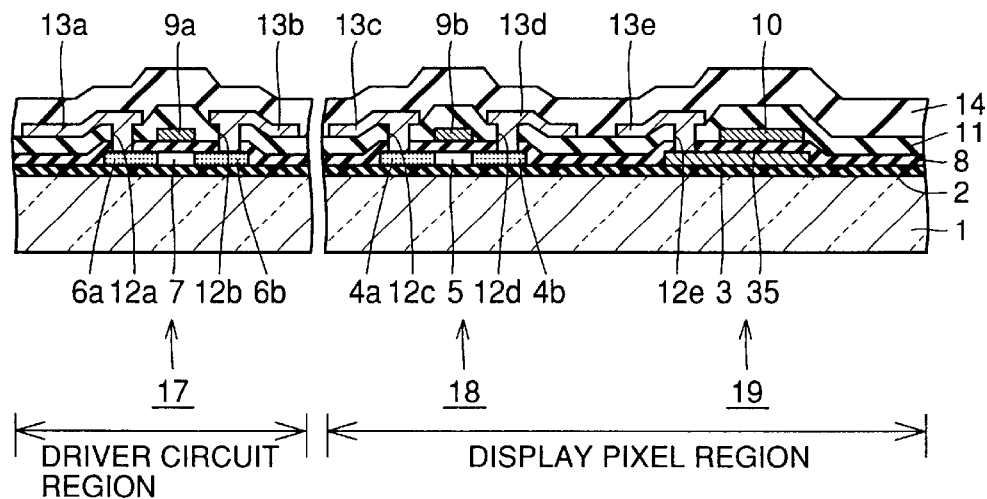

A resist film is then formed on protective film 11. Protective film 11 and insulative film 8 are partially removed by anisotropic etching using the resist film as a mask, so as to form contact holes 12a to 12e (FIG. 7). Thereafter, the resist film is removed. A chrome film (not shown) is formed in contact holes 12a to 12e by sputtering to extend on protective film 11. A thickness of the chrome film is about 100 nm. An aluminum containing alloy film is formed on the chrome film by sputtering. A thickness of the aluminum containing alloy film is 400 nm. A resist film is formed on the aluminum containing alloy film. The aluminum containing alloy film and the chrome film are partially etched and removed using the resist film as a mask to form electrodes 13a to 13e (FIG. 7). The resist film is then removed. A treatment such as hydrogenation is performed on channel regions 5 and 7 by a hydrogen plasma to enhance the properties of p and n type thin-film field effect transistors 17 and 18 and stabilize them. An insulative film 14 (FIG. 7) is formed on electrodes 13a to 13e and protective film 11. A silicon nitride film is for example used as insulative film 14. This forms a structure shown in FIG. 7.

As described above, p type thin-film field effect transistor 17 is formed in the driver circuit region of glass substrate 1, and n type thin-film field effect transistor 18 and storage capacitor 19 are formed in the display pixel region. Further, in the driver circuit region, an n type thin-film field effect transistor may be formed in the other region not shown in the drawing. Similarly, in the display pixel region, a p type thin-film field effect transistor may be formed in other region. In the driver circuit region, the p and n type thin-film field effect transistors are combined to form a driver circuit. In the display pixel region, n type thin-film field effect transistor 18 and a transparent electrode are combined to form a display pixel.

More specifically, after the step described with reference to FIG. 7, in the region on electrode 13d, a contact hole 15 (FIG. 1) is formed in insulative film 14 after planarizing the upper surface of insulative film 14. Thereafter, an ITO pixel electrode 16 (FIG. 1) is formed in contact hole 15 to extend on insulative film 14. Then, an orientation film 36a FIG. 1) is formed on ITO pixel electrode 16. As shown in FIG. 1, upper glass substrate 21 with color filter 23, opposed electrode 22 and orientation film 36b is prepared, which is arranged opposite to glass substrate 1 and fixed. Liquid crystal 20 is poured into a gap between glass substrate 1 and upper glass substrate 21 (a gap between orientation films 36a, 36b) to seal the gap, so as to provide a liquid crystal display as shown in FIG. 1.

Second Embodiment

A liquid crystal display according to the second embodiment of the present invention is provided with a structure similar to that of FIG. 1. The manufacturing method of the liquid crystal display will be described with reference to FIGS. 8 to 10.

Figure 8:
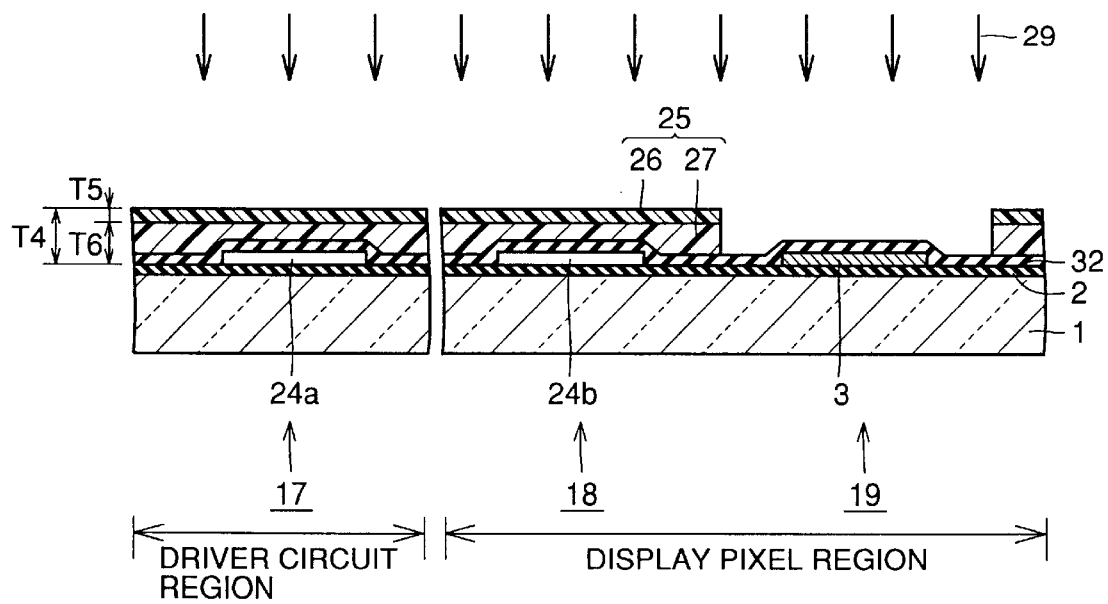
FIGS. 8 to 10 schematic cross sectional views respectively shown in conjunction with the first to third steps of the manufacturing method of a second embodiment of the liquid crystal display of the present invention.

The process up to formation of base film 2 and polysilicon films 24a to 24c as semiconductor films on glass substrate 1 is the same as in the first embodiment of the present invention. Thereafter, an insulative film 32 (FIG. 8) as a protective film is formed on polysilicon films 24a to 24c in the second embodiment of the present invention. For insulative film 32, a silicon oxide film formed for example by PECVD is used. A silicon nitride film may be used for insulative film 32. A thickness of insulative film 32 is 10 nm. Then, a resist film 25 having a thickness T4 is formed on insulative film 32 as shown in FIG. 8. Phosphorus ions 29 are implanted into polysilicon film 24c using resist film 25 as a mask. The implantation energy of phosphorus ions 29 is $1.60 \times 10^{-15}$J (10 keV). The implantation of phosphorus ions forms lower electrode 3. Due to the implantation of phosphorus ions 29, the portion of resist film 25 including an upper surface turns to changed layer 26 of which property has been changed by ion implantation. A thickness of changed layer 26 is T5. A thickness of unchanged layer 27 is T6.

Here, insulative film 32 may be formed by CVD such as PECVD, it may be formed by sputtering. Thus, CVD or sputtering enables insulative film 32 to have a precisely controlled thickness. In addition, insulative film 32 has a sufficient thickness. Insulative film 32 may be formed by oxidizing the surfaces of polysilicon films 24a to 24c by irradiating the surfaces thereof with ultraviolet light.

Insulative film 32 may be formed continuously to an amorphous silicon film deposited for the purpose of forming polysilicon films 24a to 24c. In this case, insulative film 32 may form a nitride film or an oxide film by nitridizing or oxidizing the surface of amorphous silicon film by a nitride plasma or oxide plasma. This simplifies the manufacturing process because insulative film 32 can be formed continuously to the amorphous silicon film.

Insulative film 32 may be formed on the amorphous silicon film by CVD or the like. This also allows insulative film 32 to be formed continuously to the amorphous silicon film, an effect similar to the above example is produced.

Figure 9:
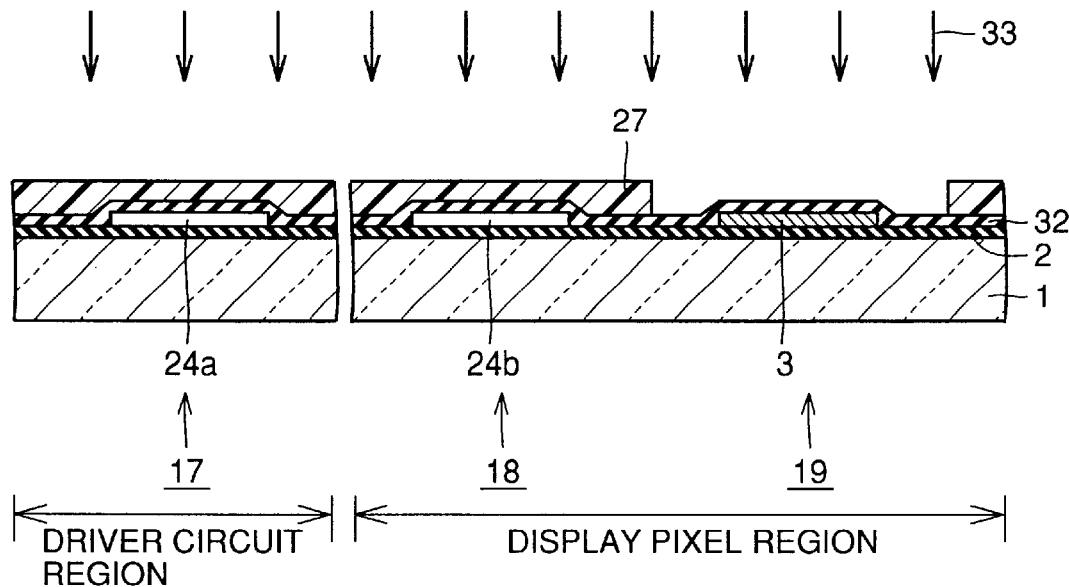

Then, as shown in FIG. 9, changed layer 26 is removed by plasma ashing using an oxygen plasma 33. At the time, a process condition that ensures removal of changed layer 26 of thickness T5 is set to avoid any residue of changed layer 26. Since insulative film 32 is formed as a protective film, it is ensured that phosphorus ions left in resist film 25 are not re-implanted into polysilicon films 24a, 24b during plasma ashing. Further, since insulative film 32 is provided with a sufficient thickness of about 10 nm, i.e., at least 8 nm, re-implantation of phosphorus ions into polysilicon films 24a, 24b is reliably prevented.

After changed layer 26 is removed by plasma ashing, remaining unchanged layer 27 is removed for example by an organic amine containing resist stripper.

The conditions for oxygen plasma ashing are as follows. An ambient pressure is 200 Pa, a flow of oxygen is 0.6 liter/minute (600 sccm), and a plasma power is 1 kw. Note that a rate of removing resist film 25 changes according to the condition of a device or the like. Thus, the process time is finely adjusted according to the thickness of the resist to be removed. If fine adjustment is difficult due to high removing rate, lest one of the plasma power, ambient pressure and oxygen flow is decreased to reduce the removing rate. This facilitates fine adjustment of the removing rate.

A stripper including dimethyl sulfoxide and monoethanolamine, respectively in contents of 30% and 70%, is used as the above described resist stripper. The temperature of the stripper is 80° C. The process time when using such solution is about 180 seconds. In addition, since a plurality of substrates can simultaneously be processed in a stripper tank of one stripping device, a substantial process time is at most one minute.

Use of an oxygen plasma 33 ensures removal of changed layer 26. Thus, the problem associated with a defect caused to the structure of the thin-film field effect transistor due to the partially left unchanged layer 26 is avoided.

Figure 10:
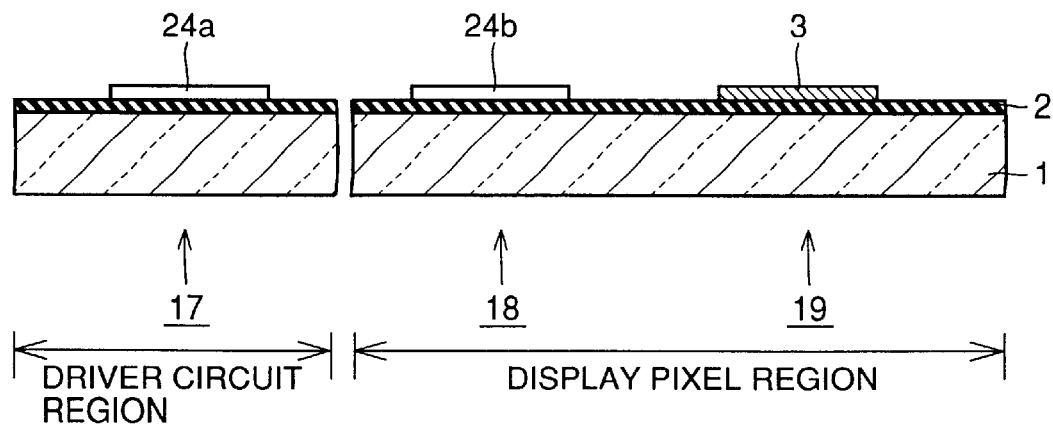
Figure 13:
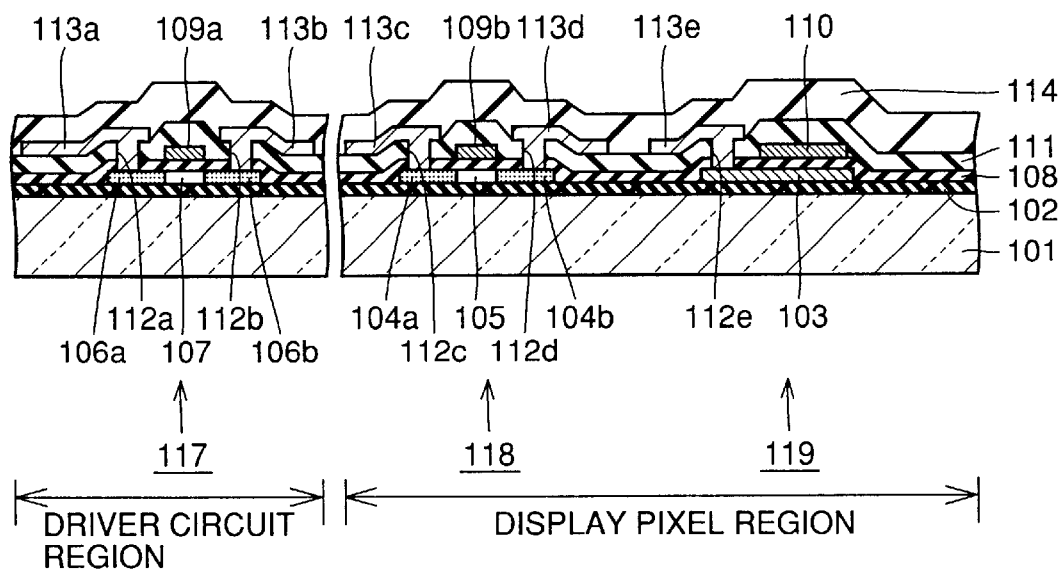
FIG. 13 is a schematic cross sectional view showing a conventional liquid crystal display.
Figure 14:
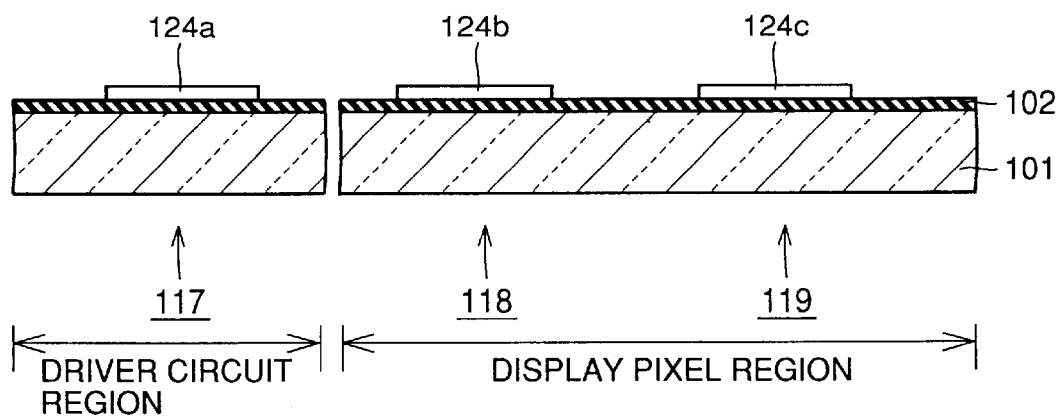
FIGS. 14 to 16 are schematic cross sectional views respectively shown in conjunction with the first to third steps of the manufacturing method of the liquid crystal display shown in FIG. 13.
Figure 15:
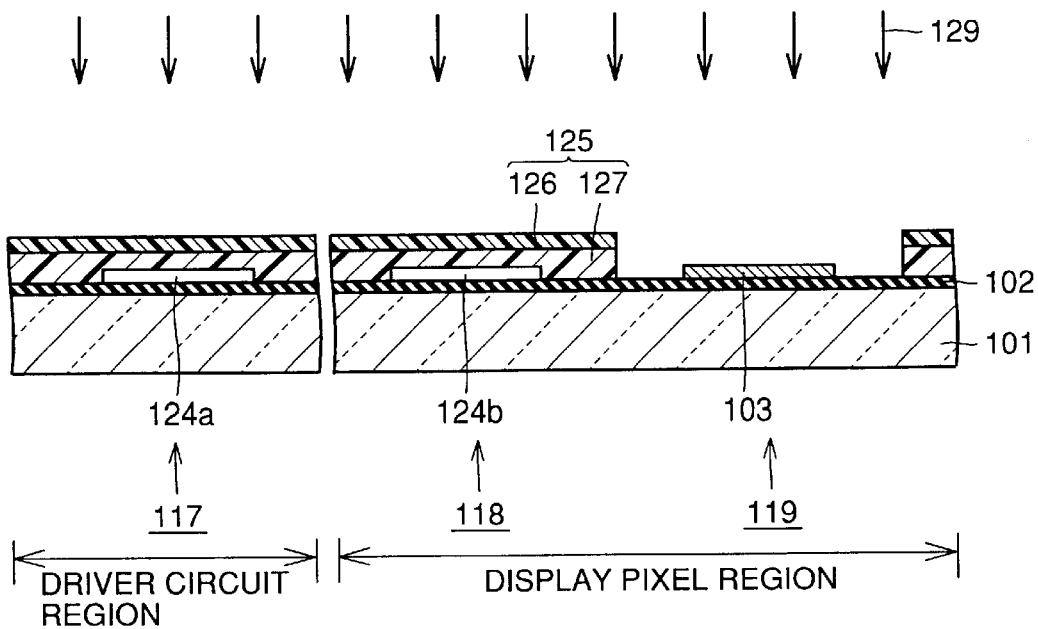
Figure 16:
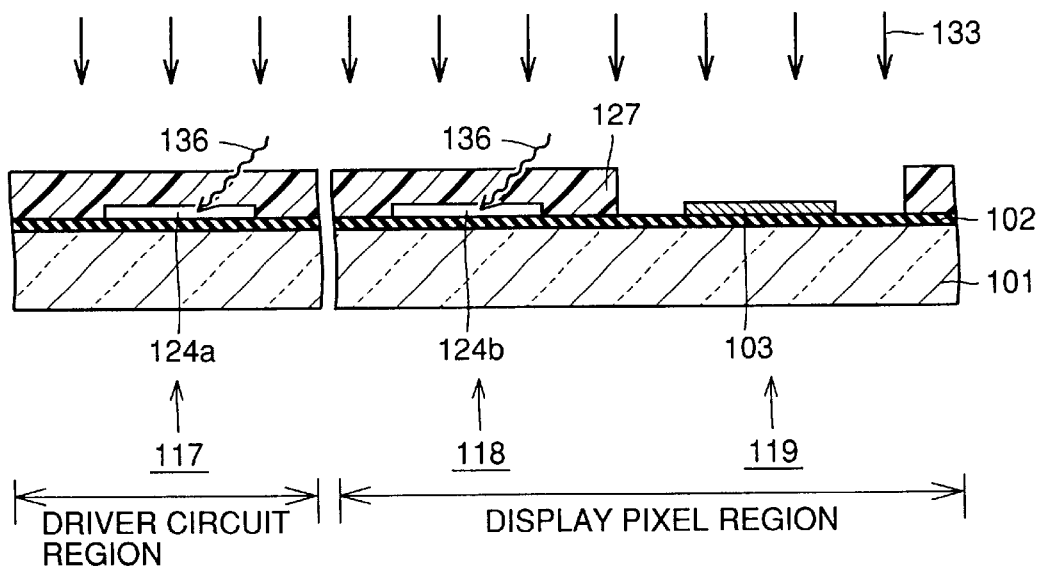

After the removal of resist film 25, insulative film 32 is removed by a hydrofluoric add containing etching solution. This provides a structure as shown in FIG. 10.

Thereafter, the process described with reference to FIGS. 5 to 7 of the manufacturing method of the liquid crystal display according to the first embodiment of the present invention is performed to provide a liquid crystal display.

Insulative film 8 to be insulative film portion 35 is formed on lower electrode 3 after implantation of phosphorus ions 29 into lower electrode 3, so that damage to insulative film portion 35 (FIG. 1) due to implantation of phosphorus ions 29 (FIG. 8) is prevented. Accordingly, the quality of the insulative film portion 35 would not be impaired. As a result, an effect similar to that in the first embodiment of the present invention is produced.

The process similar to that of the first embodiment of the present invention may be performed with insulative film 32 as a protective film being left. Namely, resist film 25 may be removed by irradiation of ultraviolet light or the wet process as described with reference to FIG. 4, instead of the step of FIG. 9, with insulative film 32 being left.

Third Embodiment

Referring to FIGS. 11 and 12, the manufacturing method of the liquid crystal display will be described.

Figure 2:
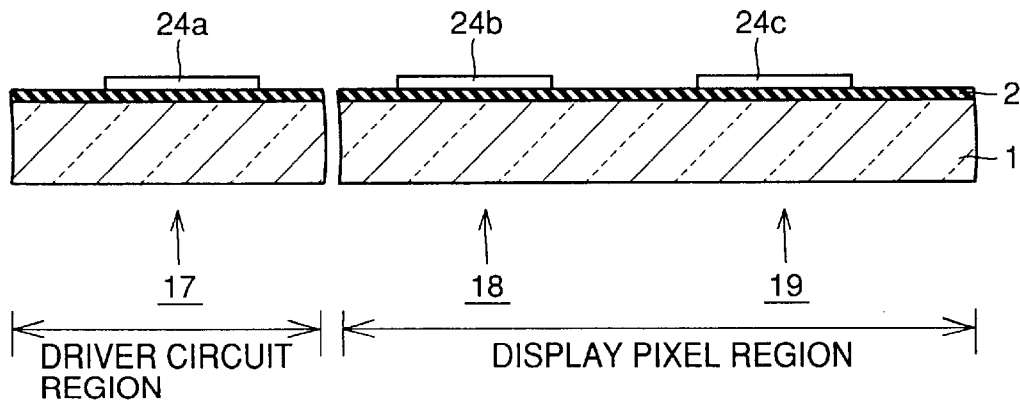
FIGS. 2 to 7 are schematic cross sectional views respectively shown in conjunction with the first to sixth steps of the manufacturing method of the liquid crystal display shown in FIG. 1.

First, polysilicon films 24a to 24c (FIG. 2) are formed by the process similar to that shown in FIG. 2 of the first embodiment of the present invention. Then, the surfaces of polysilicon films 24a to 24c are oxidized by irradiating them with ultraviolet light to form insulative films 34a to 34c (FIG. 11) of silicon oxide films. A silicon nitride film may be used for insulative films 34a to 34c. The thickness of insulative films 34a to 34c is about 3 nm. As shown in FIG. 11, a resist film 25 is formed in a region excluding a portion where storage capacitor 19 is to be formed. A thickness T7 of resist film 25 is about 1.8 μm. Phosphorus ions 29 are implanted into polysilicon film 24c under the condition similar to that of implantation of phosphorus ions in the first embodiment of the present invention. This forms a lower electrode 3. The implantation of phosphorus ions 29 allows a layer including an upper surface of resist film 25 to be a changed layer 26 having a thickness T8. An unchanged layer 27 of a thickness T9 is positioned under changed layer 26.

Here, since insulative films 34a to 34c are formed by irradiation of ultraviolet light, insulative films 34a to 34c can be formed by a simple and time-saving process. It is noted that insulative films 34a to 34c may be formed by oxidizing the surfaces of polysilicon films 24a to 24c using an agent having an oxidization ability such as a hydrogen peroxide solution, instead of ultraviolet light irradiation. They may be formed continuously to the amorphous silicon film used for forming polysilicon films 24a to 24c. When the insulative film is formed continuously to the amorphous silicon film, an oxide film or a nitride film may be formed by nitridizing or oxidizing the surface of the amorphous silicon film using a nitride plasma or an oxide plasma as described above. In this case, a structure somewhat different from that of FIG. 11 is obtained. Namely, the insulative film continuous to the amorphous silicon film is formed only on the upper surface of polysilicon films 24a to 24c and not on the side wall of polysilicon films 24a to 24c.

Referring to FIG. 12, changed layer 26 which has been formed in the step shown in FIG. 11 is removed by oxygen plasma ashing using oxygen plasma 33. At the time, the thickness of resist film 25 to be removed by the oxygen plasma ashing is set to enable complete removal of unchanged layer 26. For example, if the thickness to be removed is set at about 1.5 μm, complete removal of changed layer 26 is achieved. A portion of unchanged layer 27 is left in a thickness of about 0.3 μm after the oxygen plasma ashing. The left portion of unchanged layer 27 is removed for example by an organic amine containing resist stripper. Here, the conditions for the oxygen plasma process and the process using the resist stripper are the same as the oxygen plasma ashing and the process using the resist stripper of the second embodiment of the present invention. Unchanged layer 27 can be reliably removed by the resist stripper. Thereafter, insulative films 34a to 34c are removed by a hydrofluoric add containing etching solution. This results in a structure similar to that of FIG. 10. Then, the process similar to that of FIGS. 5 to 7 are performed to provide a liquid crystal display. In the third embodiment, an effect similar to those of the first and second embodiments of the present invention can also be produced.

If thickness T7 of resist film 25 is set at a relatively large value of at least 2.0 μm prior to the step shown in FIG. 11, unchanged layer 27 can be left in a thickness of at least 0.5 μm when changed layer 26 including the surface of resist film 25 is removed by the oxygen plasma ashing as shown in FIG. 12. This alleviates the problem of re-implantation of the impurities into polysilicon films 24a, 24b in the oxygen plasma ashing process because of the presence of unchanged layer 27 of the resist film having a relatively large thickness when insulative films 34a to 34c are not formed. This enables the conductive impurity concentration of channel regions 5 and 7 to be at most $10^{16}$ atoms/cm$^3$. Accordingly, the number of steps can be reduced since formation of insulative films 34a to 34c is unnecessary.

If the resist film is used for patterning an interconnection, a thick resist film impairs positional accuracy of the pattern. Thus, the thickness of the resist turn cannot be increased. If the region with storage capacitor 19 is separated from the other region as shown in FIGS. 3, 8 and 11, such strict dimensional accuracy is not required as in forming the interconnection. Thus, thick resist film 25 does not impair the properties of the semiconductor device. Further, the resist film is generally applied by a spin coating method. The thickness of resist film 25 is easily adjusted by controlling the rotating speed during application of the resist. Increased thickness of resist film 25 provides an effect similar to those of the first to third embodiments of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
   a thin-film field effect transistor;
   a conductive layer;
   a substrate;
   a semiconductor film including a channel region of said thin-film field effect transistor on said substrate wherein said conductive layer is in the same layer as said semiconductor film; and
   a dielectric film on said conductive layer, wherein said channel region includes an impurity concentration not exceeding $10^{16}$ atoms/cm$^3$ and said dielectric film includes an impurity concentration not exceeding $10^{17}$ atoms/cm$^3$.

2. The semiconductor device according to claim 1, wherein said thin-film field effect transistor has source and drain regions of a first conductivity type, and said impurities produce a second conductivity type opposite to the first conductivity type.

3. The semiconductor device according to claim 1, wherein said thin-film field effect transistor has source and drain regions of a first conductivity type, and said impurities produce the first conductivity type.

4. A liquid crystal display including the semiconductor device according to claim 1.

\* \* \* \* \*